United States Patent
Kleinpenning et al.

(10) Patent No.: US 9,065,427 B2
(45) Date of Patent: Jun. 23, 2015

(54) CONTROLLER AND METHOD FOR OUTPUT RIPPLE REDUCTION OF A JITTERING FREQUENCY SWITCHED MODE POWER SUPPLY

(75) Inventors: Jeroen Kleinpenning, Lent (NL); Hans Halberstadt, Groesbeek (NL); Frank Paul Behagel, Nijmegen (NL)

(73) Assignee: NXP B.V., Eindhoven (NL)

( * ) Notice: Subject to any disclaimer, the term of this patent is extended or adjusted under 35 U.S.C. 154(b) by 218 days.

(21) Appl. No.: 13/821,158

(22) PCT Filed: Sep. 9, 2011

(86) PCT No.: PCT/IB2011/053944
§ 371 (c)(1),
(2), (4) Date: May 15, 2013

(87) PCT Pub. No.: WO2012/035474
PCT Pub. Date: Mar. 22, 2012

(65) Prior Publication Data
US 2013/0300464 A1    Nov. 14, 2013

(30) Foreign Application Priority Data

Sep. 13, 2010   (EP) .................................. 10176422

(51) Int. Cl.
*H02M 3/335* (2006.01)
*H03K 5/00* (2006.01)
*H03K 7/08* (2006.01)
*H02M 1/44* (2007.01)

(52) U.S. Cl.
CPC ............. *H03K 5/00006* (2013.01); *H02M 1/44* (2013.01); *H02M 3/33507* (2013.01); *H03K 7/08* (2013.01)

(58) Field of Classification Search
CPC .......... H02M 1/14; H02M 1/143; H02M 1/44; H02M 3/335; H02M 3/33507; H03K 7/08; H03K 5/00006
USPC .................................. 323/271, 282–285, 351; 363/21.01–21.18
See application file for complete search history.

(56) References Cited

U.S. PATENT DOCUMENTS

| | | | |
|---|---|---|---|
| 6,249,876 B1 | 6/2001 | Balakrishnan et al. | |
| 8,829,875 B2 * | 9/2014 | Morrish | ........................ 323/282 |
| 2005/0253636 A1 | 11/2005 | Yang et al. | |
| 2006/0031689 A1 | 2/2006 | Yang et al. | |
| 2008/0094047 A1 * | 4/2008 | Huynh et al. | .................. 323/282 |
| 2010/0020573 A1 | 1/2010 | Melanson | |
| 2011/0110126 A1 * | 5/2011 | Morrish | ..................... 363/21.18 |

FOREIGN PATENT DOCUMENTS

WO    2012/036474 A1    3/2012

OTHER PUBLICATIONS

International Search Report for application PCT/IB2011/053944 (Mar. 22, 2012).

* cited by examiner

*Primary Examiner* — Timothy J Dole
*Assistant Examiner* — Ivan Laboy Andino

(57) ABSTRACT

A controller for an SMPS is disclosed. The controller applies a frequency jitter to the SMPS to reduce Electromagnetic Interference (EMI) and/or audible noise. A second input variable is multiplied by a correlated jitter signal, in order to compensate the output power for the frequency jitter. A corresponding method is also disclosed. Since the jitter compensation occurs within the controller, the method is particularly suitable for controllers operating under different control modes for different output powers (or other output criteria). The multiplicative compensation is applicable across a wide range of converter types.

15 Claims, 10 Drawing Sheets

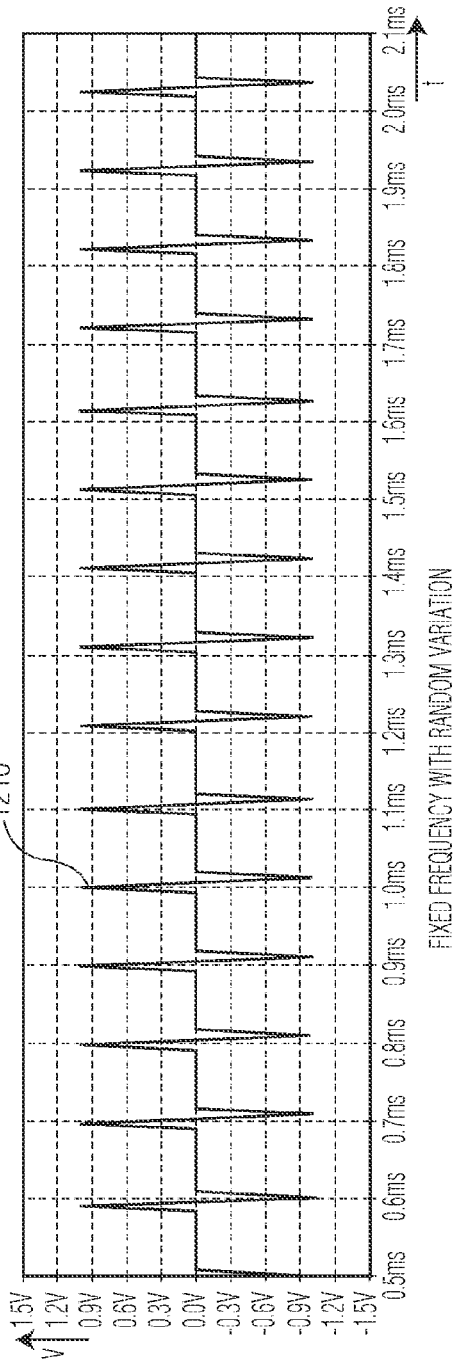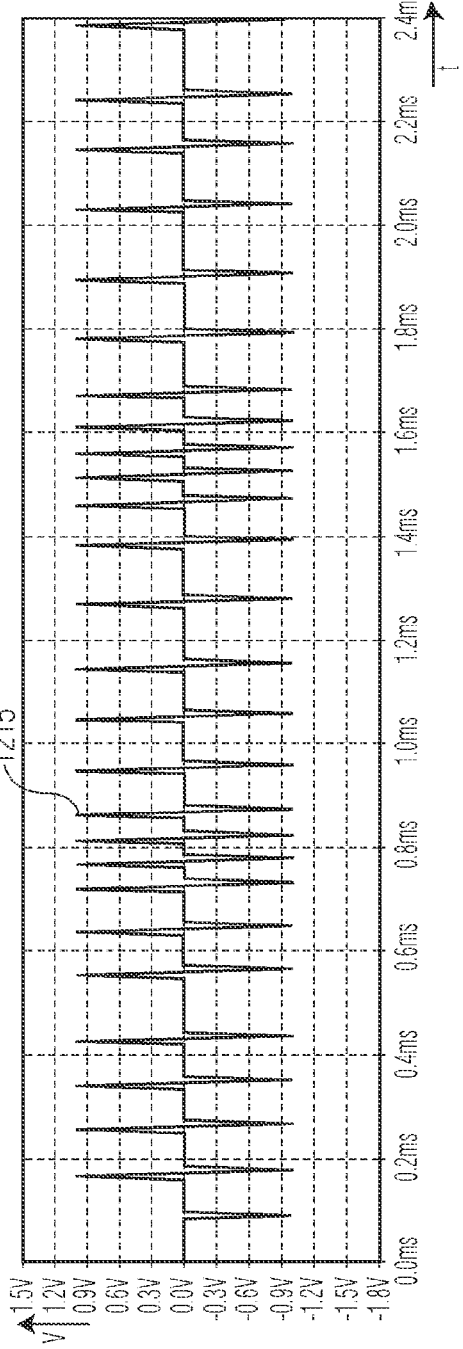
FIG. 12

CONTROLLER AND METHOD FOR OUTPUT RIPPLE REDUCTION OF A JITTERING FREQUENCY SWITCHED MODE POWER SUPPLY

FIELD OF THE INVENTION

This invention relates to controllers for switch mode power supplies (SMPS) and in particular to SMPS with jittering on the switching frequency. It further relates to methods of controlling such switched mode power supplies.

BACKGROUND OF THE INVENTION

It is well known that electromagnetic interference is an important issue for SMPS. For an SMPS operating at a fixed frequency, the EMI spectrum has strong peaks at discrete frequencies, which may exceed allowable EMI limits.

Another issue with SMPS converters is audio noise. The audio signals can result from low power modes or burst modes which are used to provide high efficiency operation, and which have switching frequencies in the audible region.

A known solution to this problem, particularly for EMI interference, is to vary the operating frequency around the specific fixed frequency, in order to "smear out" the peaks. This is known as jittering the frequency: jittering is well known, and a variety of different types of signal can be used, provided generally only that the jittering results in an average frequency which is that of the underlying specific frequency. Non-limiting examples of possible jitter functions are sine functions and triangular functions, (either symmetric or sawtooth).

The use of frequency jittering can also spread audible noise over a wider frequency spectrum, so that it will be perceived by the human ear as a lower level of noise. Especially when random jitter is applied with sufficient amplitude of the jitter, this is interpreted as white noise that is less irritating than sound including dominant frequencies.

An example of the application of frequency jitter is disclosed in U.S. Pat. No. 6,249,849 B1, Balakrishnan, et al., "Frequency Jittering Control for Varying the Switching Frequency of a Power Supply. In U.S. Pat. No. 6,249,876 B1, the frequency jitter is applied by using an oscillator that determines the operating frequency and the oscillator output is then used as clock for a counter. The counter value is converted to an analog value in the current domain and the current is fed back to the charge and discharge current of the oscillator.

Introducing frequency jitter can result in more complex control. For instance, when the frequency is adapted by a main regulation loop it is difficult to apply frequency jitter because the bandwidth of the regulation loop should be much lower than the modulation frequency of the jitter to prevent that the applied frequency jitter is compensated by the regulation loop. This low bandwidth requirement of the control loop can conflict with a fast response on a load step.

It would be desirable to be able to compensate for frequency jitter. It is known from United States Patent Application publication US2005/253636, in which jittering is applied to the control of a flyback converter by adapting the frequency by a jittering signal, to add a copy of the jitter signal to the primary peak current in order to compensate for the change in output power introduced by the frequency jitter.

In United States Patent Application publication US2005/253636, first and second jitter currents are used. The switching frequency increases whenever the first jitter current increases. The impedance of an attenuator is decreased whenever the second jitter current increases. This reduces the on-time of a PWM output signal which compensates for the frequency change and keeps the output power constant. The jitter control is based on adding current to the charge and discharge currents of the oscillator of the PWM controller.

United States patent application publication US2006/031689 discloses a similar summation method, in which a copy of the jitter signal is added to the primary peak current. In this case the jitter signal is a digital pattern, rather than an analog signal.

However, such summation methods suffer the disadvantage that summation is an absolute compensation, rather than a relative compensation. Thus, the methods are well suited to a single operating frequency, but less suited to variable operating points, such as variable frequencies or output power.

There thus remains a need for a method of jitter compensation, which does not suffer from the above disadvantages to the same extent.

SUMMARY OF THE INVENTION

It is an object of the present invention, to provide a controller for an SMPS, and a method of operating an SMPS, which does not suffer from the above disadvantages to the same extent.

According to a first aspect of the invention, there is provided a controller for a switched mode power supply and being operable to control the switched mode power supply in dependence on a frequency input signal and in dependence on a further input signal, comprising:

a frequency jitter unit for multiplying the frequency input signal by a frequency jitter signal to derive a modified frequency input signal to be applied to the switched mode power supply, and a further jitter unit for multiplying the further input signal by a further jitter signal to derive a modified further input signal to be applied to the switched mode power supply, wherein the further jitter signal is correlated to the frequency jitter signal such that the jitter applied by the frequency jitter unit and the jitter applied by the further jitter unit vary in proportion with each other.

By modifying the frequency input signal and the further input signal by multiplication, and before application to the switched mode power supply, the jitter function can be used for different control schemes (for example PWM control, PFM control or in combined PWM and PFM control). The multiplications can be performed independent of the actual values of the frequency input signal or the further input signal.

In embodiments, the correlation is such that variation in an output power of the switched mode power supply due to the frequency jitter signal is cancelled by the further jitter signal.

Thus, the desired combination of the jittering of the frequency and a second variable (such as peak current), is then such that for every operating point, the delivered output power is the same as if there were no jittering, because the jitter components cancel each other. This means the controller of the invention can be applied to different modes of operation, such as frequency control or peak current control, with the jittering process handled by an independent unit which provides the correct settings for the jittering function for different operating points. This independent unit ensures that the effect of the jittering is not visible at the delivered output power of the power supply.

Particularly in the case of known, defined relationships between the output power and the input frequency and further input, it may be trivial to determine the correlation. For instance, in embodiments, the controller is configured to control a flyback converter in discontinuous control mode by means of primary peak current control, the other input is primary peak current, and the further jitter signal is opposite in sign and half the magnitude of the frequency jitter signal. This correlation between the frequency jitter signal and the further jitter signal is a direct consequence of the relationship between the output power (P), the switching frequency (Fswitch), and the primary peak current (Ipeak):

$$P = \frac{1}{2} * L * Ipeak^2 * Fswitch \quad (1)$$

In embodiments the controller is configured to control a buckboost converter or a flyback converter, and further configured to operate the converter in discontinuous conduction mode. Such embodiments are particular advantageous, in that there is a fixed 2:1 ratio at which the output power has no ripple.

In embodiments the frequency jitter signal has the form of one of the group comprising a triangular function, a saw-tooth function and a sine function. Thus the frequency jitter signal has a gradual variation over one period with a rising slope and a falling slope, although other forms of jitter functions are not excluded from the invention, A triangular function is particular convenient, since it results in a uniform distribution of the jittered frequency.

In embodiments, at least one of a frequency of the frequency jitter signal is less the 1 kHz, and a depth of the frequency jitter signal is between 0.9% and 33%. By limiting the jitter frequency (that is to say, the inverse of the period over which the switching frequency varies due to the jitter) to less than 1 kHz, audible noise, which could be a distraction to an end user, is reduced or minimised.

In embodiments, the controller has a yet further input different to the further input and being adapted to operate according to a first control mode at a first output power, and a second, different, control mode at a second output power, further comprising a yet further jitter unit for multiplying the yet further input by a yet further jitter signal, wherein yet the further jitter signal is correlated to the frequency jitter signal. In such embodiments, the controller may be adapted to switch between two control modes at, for instance, a specific operating frequency. Conventional methods of providing jitter may result in rapid cycling beyond the specific frequency and back, due to added jitter which changes the output power, and thus rapid cycling between two control modes; this phenomenon is termed "bouncing". In embodiments of the invention, jitter compensation may be carried out within the control loop, and are thus embodiments of the invention may prevent or avoid such bouncing between the two control modes of operation.

In embodiments, the controller comprises at least a part of an integrated circuit.

According to another aspect of the present invention, there is provided a method of controlling a switched mode power supply in dependence on a frequency input and in dependence on a further input, comprising:

multiplying the frequency input by a frequency jitter signal; and multiplying the further input by a further jitter signal, wherein the further jitter signal is correlated to the frequency jitter signal such that the jitter applied by the frequency jitter signal and the jitter applied by the further jitter signal vary in proportion with each other.

The correlation may be such that variation in an output power of the switched mode power supply due to the frequency jitter signal is cancelled by the further jitter signal. In embodiments the frequency jitter signal has the form of either a triangular function or a sine function. Furthermore, in embodiments, a jitter frequency may be less than 1 kHz, and additionally or in the alternative, a jitter depth may be between 0.9% and 33%.

In embodiments, the controller operates according to a first control mode at a first output power, and a second, different, control mode at a second output power, wherein, whilst the controller is operating in the second control mode, multiplying a yet further input, different to the further input, by a yet further jitter signal, and wherein yet the further jitter signal is correlated to the frequency jitter signal.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which

FIG. 12 shows graphs to explain a control method in which random jitter is applied to make audible noise less disturbing.

Figure 1:
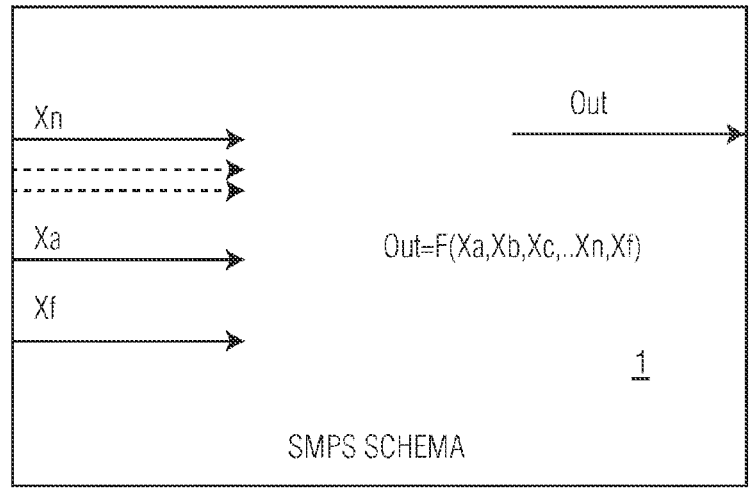
FIG. 1 shows a SMPS control schema without jitter.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

Embodiments of the invention based in part on the realisation that, for many converter types, such as, without limitation, flyback, boost, buck, and boost-buck, there is at least one other way, besides frequency control, to regulate the output power. Then, in contrast to the known technique of US2005/253636 in which a copy of the jitter function is added to the output in order to compensate of the jitter, the inventors have appreciated that a predetermined feed-forward action may be implemented, wherein the effect of the frequency jitter is cancelled by applying an appropriate, correlated, jittering function to one of the other input variables. As a result of the correlated jittering, the system acts, as far as output power is concerned, as if there were no jitter in the first place.

FIG. 1 shows a SMPS control schema 1 without jitter. The schema has n input variables (Xa, Xb, . . . Xn) including one input variable Xf defining the switching frequency, together with an output variable Out. A general equation for a converter defined by n input variables (Xa, Xb, . . . Xn) and including one input variable Xf defining the switching frequency, together with an output variable Out, operating in a certain operating point is:

$$Out = F(Xa, Xb, \ldots Xn, Xf) \tag{2}$$

so that perturbations result in:

$$dOut = \frac{\delta P}{\delta Xa} \cdot dXa + \frac{\delta P}{\delta Xb} \cdot dXb + \ldots \frac{\delta P}{\delta Xn} \cdot dXn + \frac{\delta P}{\delta Xf} \cdot dXf \tag{3}$$

It is possible to maintain Out=constant by varying one or more variables at the same time based on their sensitivity to the output.

As a non-limiting example, consider the case of a flyback converter. Equation 2 in this case takes the form $$P = F(L, Ipeak, Fswitch) \tag{4}$$

where P is the output power, Ipeak is the primary peak current (or rather, more accurately, a signal that defines the actual primary peak current), and Fswitch is the operating frequency (or rather, more accurately, a signal that defines the actual switching frequency). For a flyback converter, equation 4 can be rewritten:

$$P = \frac{1}{2} * L * Ipeak^2 * Fswitch \tag{5}$$

Since the sensitivity of Ipeak and Fswitch to the output power P are:

$$\frac{\delta P}{\delta Ipeak} = L * Ipeak * Fswitch \tag{6}$$

And $$\frac{\delta P}{\delta Fswitch} = \frac{1}{2} * L * Ipeak^2 \tag{7}$$

respectively, then:

$$dP = \frac{\delta P}{\delta Ipeak} \cdot dIpeak + \frac{\delta P}{\delta Fswitch} \cdot dFswitch \tag{8}$$

So, keeping output power P constant results in:

$$\frac{\delta P}{\delta Ipeak} \cdot dIpeak = -\frac{\delta P}{\delta Fswitch} \cdot dFswitch \tag{9}$$

Thus, equivalently:

$$dIpeak = dFswitch * \left(-\frac{\delta P}{\delta Fswitch}\right) / \frac{\delta P}{\delta Ipeak} \tag{10}$$

Since:

$$\left(-\frac{\delta P}{\delta Fswitch}\right) / \frac{\delta P}{\delta Ipeak} = -\frac{(1/2 * L * Ipeak^2)}{(L * Ipeak * Fswitch)} \tag{11}$$

$$= -1/2 * Ipeak * Fswitch \tag{12}$$

This results in:

$$dIpeak = -dFswitch * \tfrac{1}{2} * Ipeak / Fswitch \tag{13}$$

or $$dIpeak / Ipeak = (-\tfrac{1}{2}) * dFswitch / Fswitch \tag{14}$$

Thus, in this case the correlation between the frequency jitter and primary current jitter is −2:1. That is to say, for every 1% jitter on frequency, ½% jitter on the primary peak current, is required for compensation.

In general, this 2 to 1 (or square law) correlation is valid for converters that charge their energy reservoir only from the input and discharge completely this reservoir only via the output. This is the case for flyback converters and buck-boost converters operating in discontinuous mode. For operation in continuous conduction mode the correlation increases above 2 to 1, but is not constant and depends on the operation point of the converter. For buck converters the charging current flows via the output and for boost converter the discharge current flows via the input: buck and boost converters have a correlation higher than 2 to 1 in discontinuous mode and the ratio depends respectively on the absolute output voltage and input voltage. The ratio further increases for continuous conduction mode for buck and boost converters.

Figure 2:
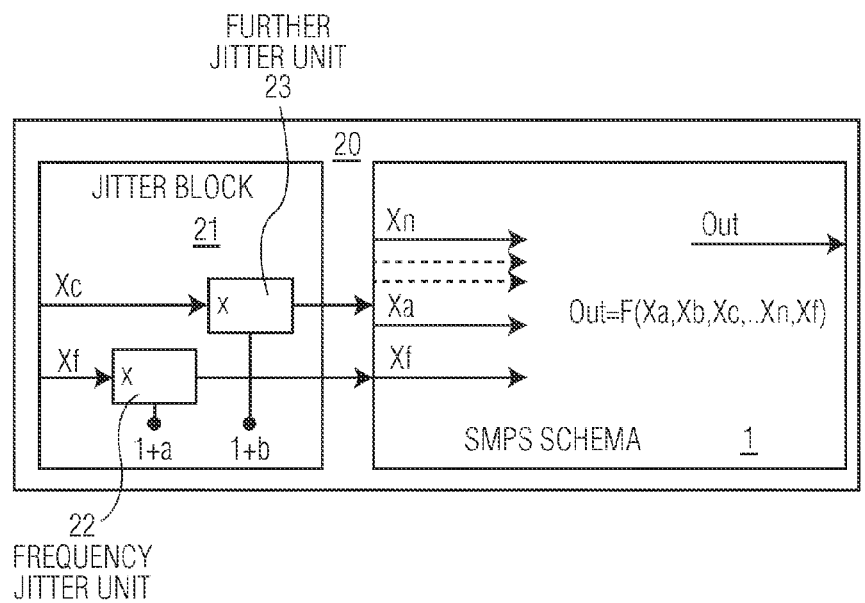
FIG. 2 shows a SMPS control schema with jitter according to embodiments of the invention.

FIG. 2 shows a SMPS control schema with jitter according to embodiments of the invention; the figure shows the same basic SMPS schema 1 as in FIG. 1, together with a jitter Block 21. The jitter block 21 applies jitter to the frequency defining variable Xf at a frequency jitter unit 22, and jitter to a further variable Xc at a further jitter unit 23. That is, 'Xf' controls the operating frequency of the converter, thereby controlling the output, while 'Xc' determines a second variable of the SMPS that controls the output (for example primary peak current or on-time or even input voltage in a flyback). In this way it is possible to choose the variation for the combination of the at least 2 variables in such a way that the output does not change.

In frequency jitter unit 22, a variation on the operating frequency is applied by a multiplier function wherein a signal Xf is multiplied by a factor "1+a", where A varies as a function of time. In the same way, at further jitter unit 23 a signal 'Xc' is multiplied by "1+b", where B varies as a function of time. If the variation for the combination of the at least 2 signals is chosen in the correct way, then there is a jittering at the operating frequency, without a net effect on the output power. In FIG. 2 a multiplier is used where an input variable is multiplied by "1+a" or "1+b". In the case of a flyback converter, the ratio A:B to provide zero effect on the output is, as determined above, −2:1.

Advantageously over the prior art summation arrangement, which maintains an absolute jitter with frequency variation, the multiplier arrangement according to embodiments of the invention provides that the jittering itself is relative (rather than absolute) in frequency controlled systems: for example a 8 kHz jitter variation at a 50 kHz switching frequency reduces to a 4 kHz jitter variation at 25 kHz switching frequency; in each case, the level of smearing out of harmonics, at the start of the EMI band at 150 kHz, is 24 kHz: this provides an optimal solution for smearing out EMI noise. In the prior art, the compensation is optimal only for a small range of operating frequencies around a predetermined operating point, while the multiplier solution with 2 multipliers is optimal for every operating point, provided only that the input variable has a proportional relation with the output variable.

A preferred minimum depth of frequency jitter may be determined by the following: considering a bandwidth of average measuring receiver of 9 kHz and a typical maximum expected switching frequency of 500 kHz: the minimum depth of frequency jitter is from −0.9% to +0.9%. Conversely, a preferred maximum depth of frequency jitter arises when the smearing out of the first spectral component (first harmonic) touches the smearing out of the second spectral component (second harmonic): the difference between spectral components is the first harmonic frequency and maximum depth of frequency jitter is therefore from −33% to +33%.

The application of jitter can be used to reduce EMI interference as explained above, but it can also (or instead) be used to reduce audible noise. The applied frequency jitter spreads the spectrum of the audible signals over a wider area so that the human ear interprets this as noise instead of one irritating frequency. This noise is less irritating and is interpreted as a lower volume level.

The skilled person will immediately appreciate that jitter on other control variables than Ipeak may be used to correlate with the frequency jitter. Further, provided that the correlation is such that the frequency jittering is cancelled (which can be readily determined from the appropriate form of equation 3 setting dOut to zero), jitter on a plurality of other control variables, at the same time, may be used. However, to realise convenient control, it will generally be the case that, for any individual control mode, it will be preferable to apply jitter on just one input variable other than frequency, to achieve the compensation or cancellation.

Figure 3:
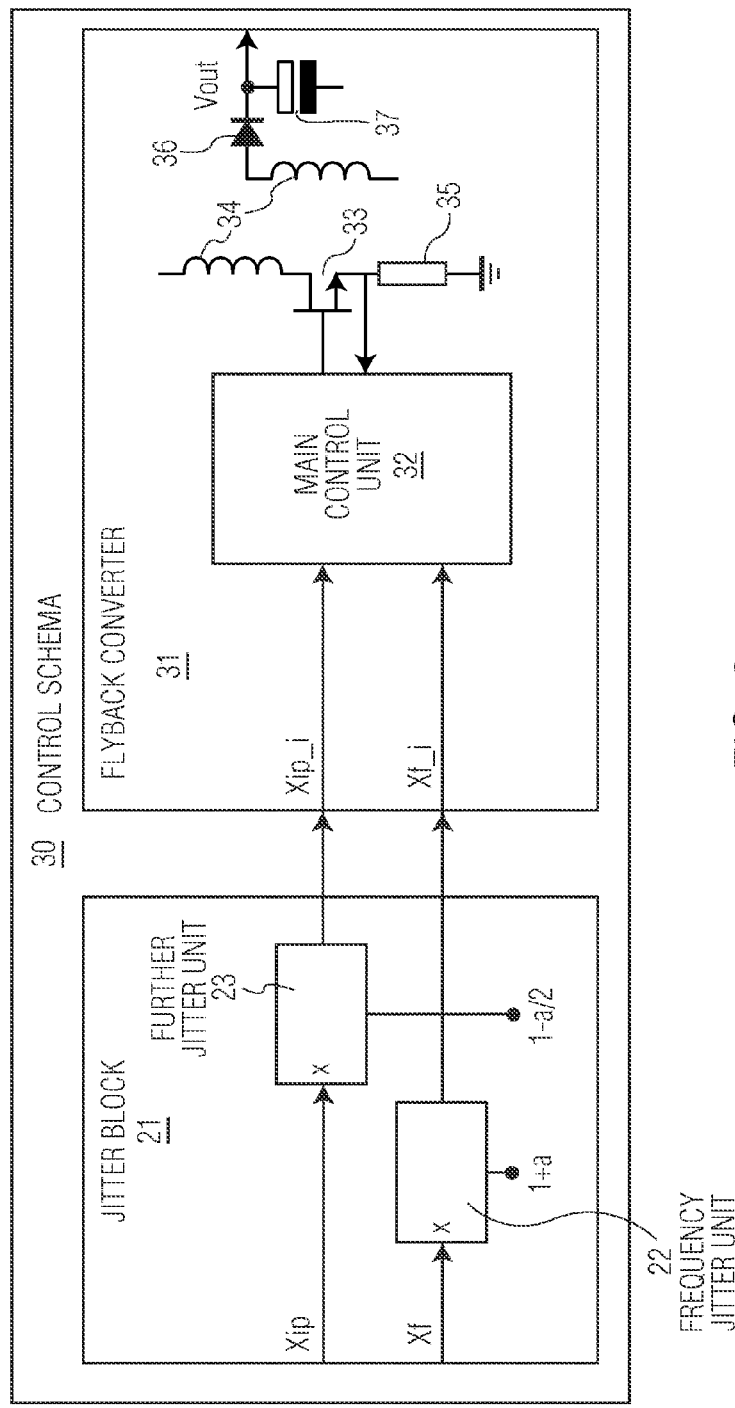
FIG. 3 shows a control schema for a flyback converter with primary peak current and frequency control and including jitter.

FIG. 3 shows a control schema 30 for a flyback converter in DCM operation mode with primary peak current and frequency control and including jitter. The figure is substantially similar to FIG. 2, with a flyback converter 31 having primary current (Ipeak) control Xip, and frequency control Xf. The converter includes a main control unit 32 configured to drive switch 33, which connects and disconnects inductor 34 across the supply via sense resistor 35 (used to feed back the primary current to the main control unit 32); the output circuit provides output voltage Vout and comprises a rectifying diode 36 and smoothing capacitor 37.

Equation 5 above applies to this arrangement:

$$P = \frac{1}{2} * L * Ipeak^2 * Fswitch \quad (5)$$

and the ratio in sensitivity of output power to Ipeak and to Fswitch results in output power remaining constant provided that equation 14 holds:

$$dIpeak/Ipeak = (-\frac{1}{2}) * dFswitch/Fswitch \quad (14)$$

In this case, the effect of the frequency on the output power will be cancelled by providing correlated jitter signals a and a/2 to Xf and Xip respectively.

For example, where a sine function is used for jitter, such as $$\alpha = 0.04 * \sin(1256 \cdot t), \quad (15)$$

then the outputs Xf_i and Xip_i from the frequency jitter unit 22 and the primary peak current jitter unit 23 respectively, are:

$$Xf\_i = [1 + 0.04 * \sin(1256 \cdot t)] * Xf, \quad (16)$$

and $$Xip\_i = [1 - 0.02 * \sin(1256 \cdot t)] * Xip, \quad (17)$$

According to embodiments of the invention, frequency jitter may be applied to an SMPS without its being directly observable in the output power—not only the average output power, but also the momentary output power. Thus, the problem of a ripple voltage and ripple current at the output of the supply due to the addition of jitter may be eliminated. This is advantageous for the control, since the control inclusive of jitter block may be considered as if no jitter were present at all. For example, the signals Fswitch and Ipeak in FIG. 3 fulfill equation 4 as if there were no jitter, although the actual Ipeak_jitter and Fswitch_jitter vary with the jittering signal A.

Figure 4:
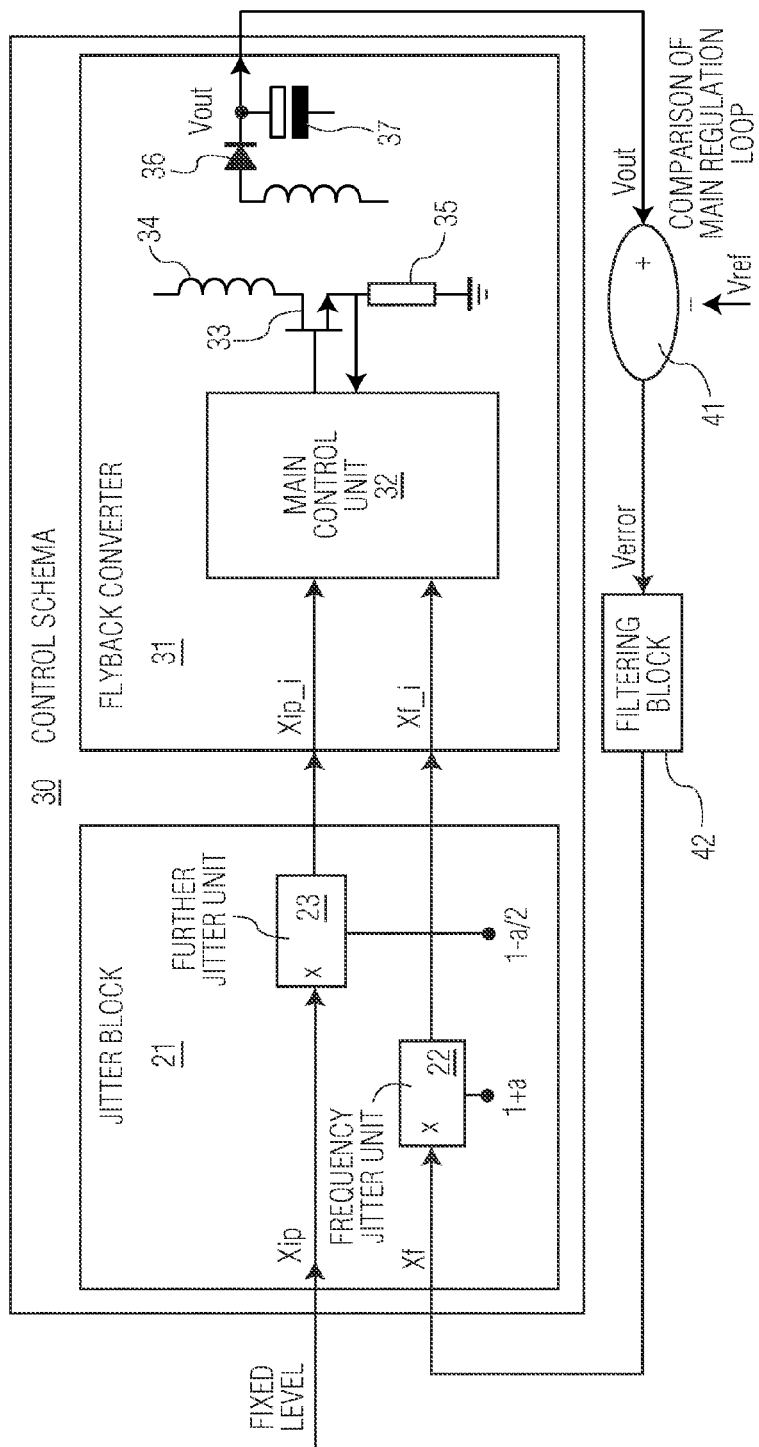
FIG. 4 shows the control schema of FIG. 3, and including a fixed primary peak current and frequency regulation loop.

FIG. 4 shows the control schema of FIG. 3, and including a primary peak current and frequency regulation loop. Of course, the skilled person will appreciate that this is one of many alternative regulation loops that fall within the scope of the invention and in particular any kind of regulation mechanism that can be added to this jittering system of FIGS. 1-3 in order to get the desired behaviour of the output variable, while only a residual effect of the jitter on output variable and input variables occurs.

The main regulation loop compares, at 41, Vout with a reference voltage Vref, resulting in an error signal Verror, which is filtered in filtering block 42. The loop thereby regulates the input 'Xf' in order to regulate Vout to the desired value in combination with a fixed value for the primary peak current setting (Xip). Due to the applied jitter mechanism according to the invention, the jitter frequency is not present in the inputs Xf, Xip and Vout when the regulation loop is closed, while both the actual operating frequency setting and Peak current setting (Xf_j, Xip_j) of the flyback converter include jitter.

Figure 5:
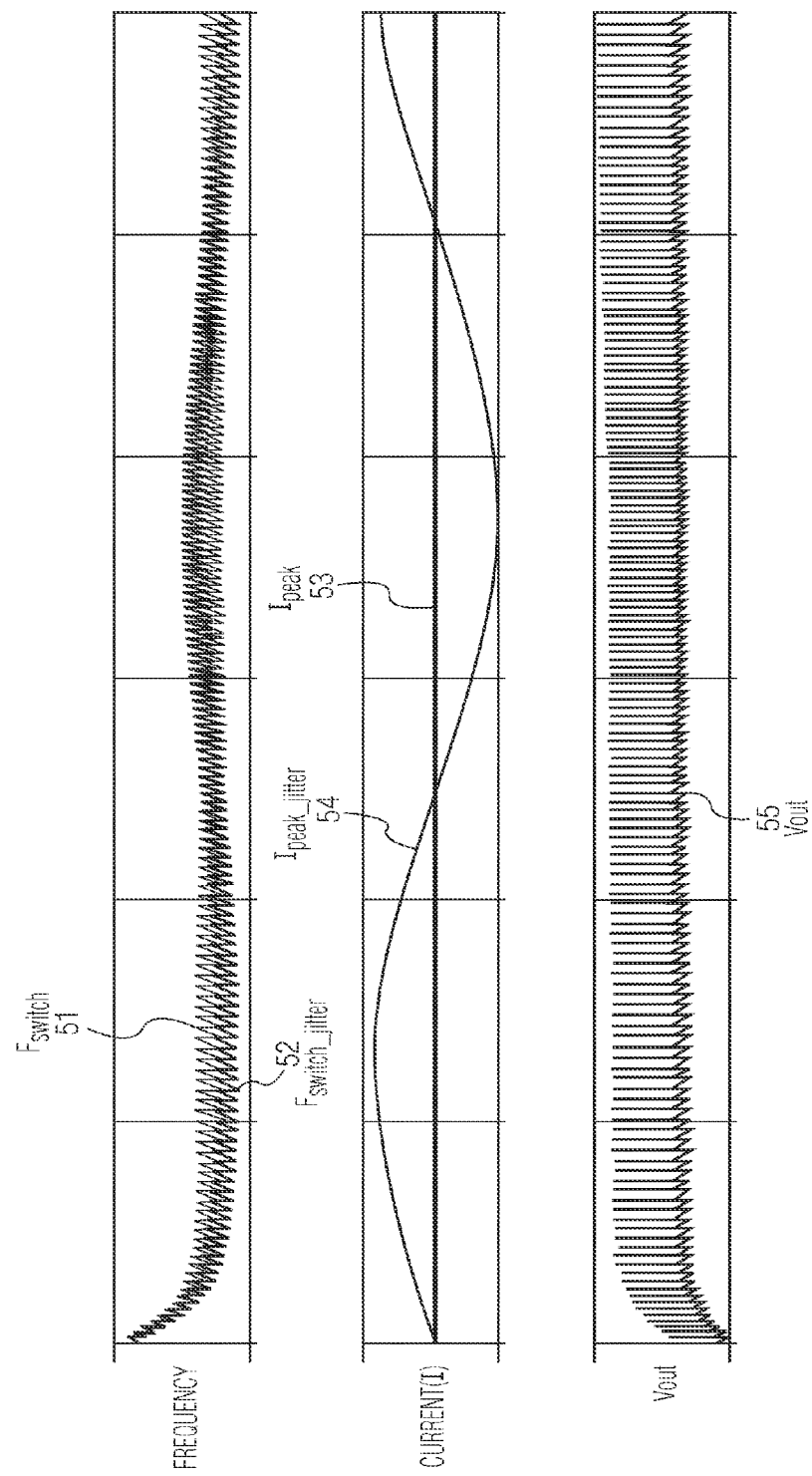
FIG. 5 shows simulated results of operating the control schema FIG. 4.

FIG. 5 shows simulated results of operating the control schema FIG. 4. The figure shows Fswitch 51 along with the jittered version Fswitch_jitter at 52, which follows Fswitch, but with a slow sine-curve jitter. The curves Ipeak 53 and Ipeak_jitter 54 are also shown—Ipeak being constant, and Ipeak_jitter having a sine curve, opposite to that on Fswitch_jitter superposed thereon. The bottom curve 55 shows Vout.

It can be seen that, after a ramp-up phase for Fswitch and Vout, the frequency jitter applied to Fswitch resulting in Fswitch_jitter, is cancelled by the correlated jitter applied to Ipeak. As a result the output voltage Vout is entirely free from jitter.

Figure 6:
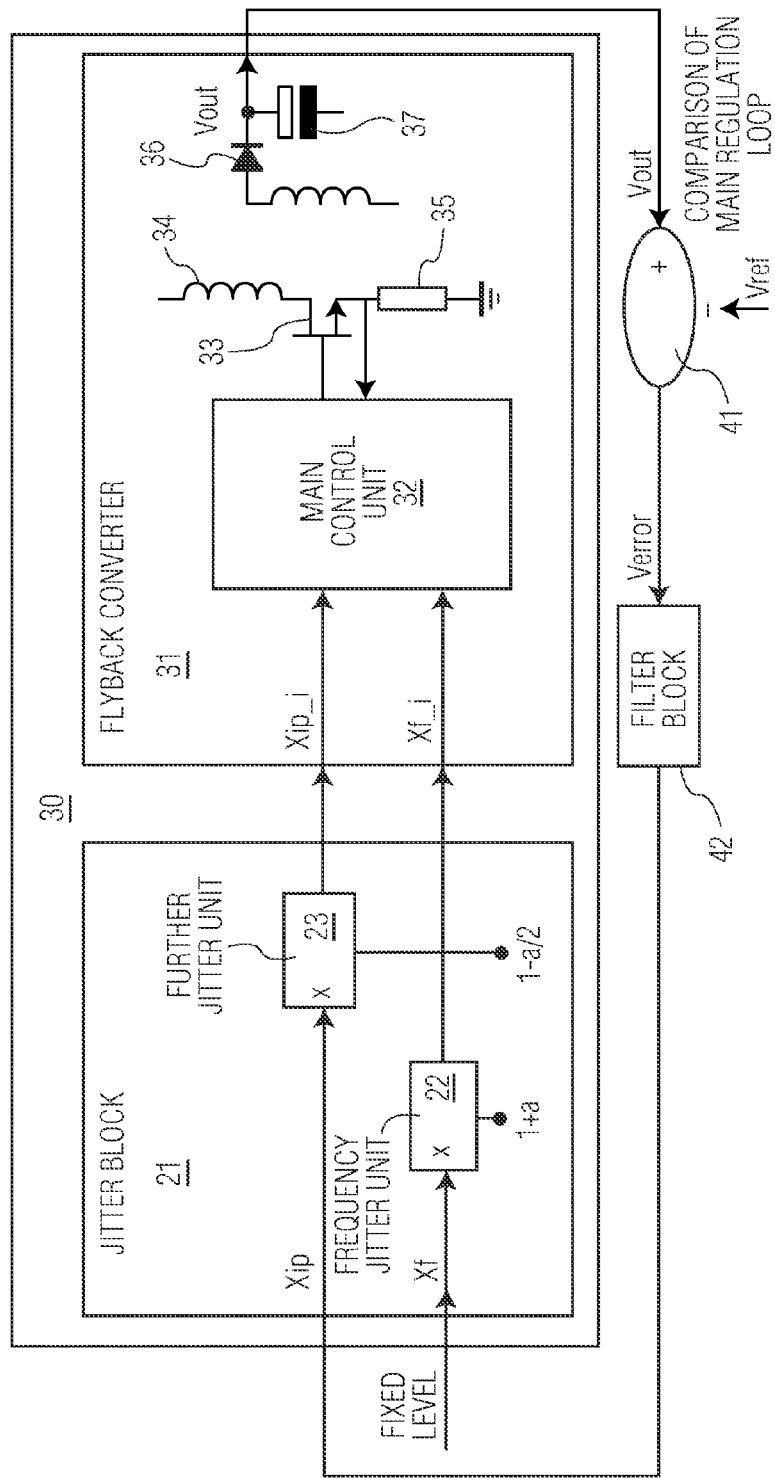
FIG. 6 shows a control schema for a SMPS having fixed frequency and primary peak current regulation, including the regulation loop.

FIG. 6 shows a control schema for a SMPS according to another embodiment of the invention. In this case, the SMPS has a fixed frequency and primary peak current regulation. That is to say the input Xf to the frequency jitter unit 22 is constant at a fixed level; conversely, the primary peak current input Xip, which is input into the further jitter unit 23, is modified by the error signal derived from filter block 42.

Figure 7:
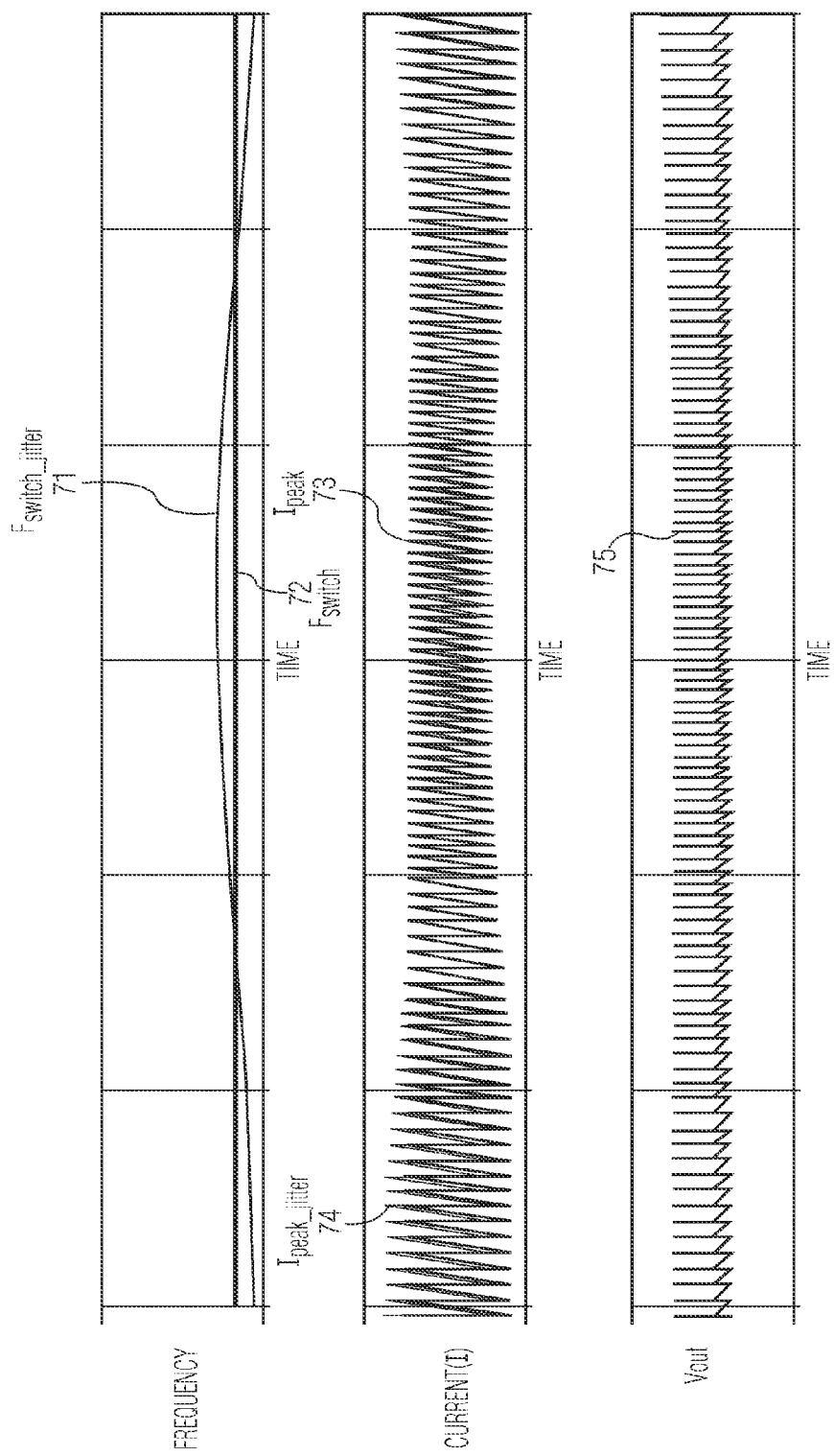
FIG. 7 shows simulated results of operating the control schema of FIG. 6.
Figure 8:
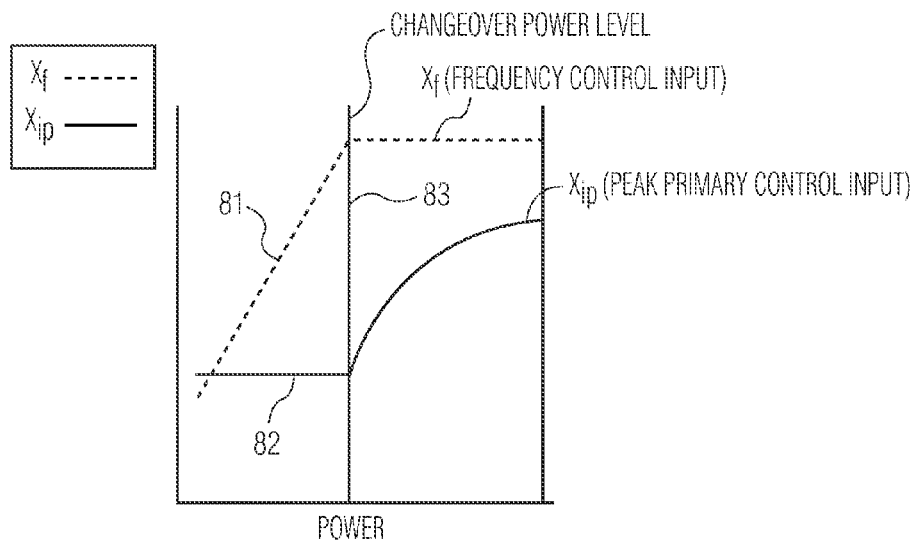
FIG. 8 shows two control inputs for a SMPS having two modes of control.

FIG. 7 shows simulated results of operating the control schema of FIG. 6; in this figure, the switching frequency Fswitch 72 is constant, and modified by the sine wave jitter function to result in the jittered switching frequency Fswitch_jitter 71; conversely the controller is by means of the peak current (which thus varies rapidly according to the on-off cycle of the SMPS) Ipeak 73, to which are correlated jitter function is applied to result in a jittered peak current Ipeak_jitter 74. As a result of the correlation between the two jitter functions, the output voltage Vout is free from jitter. It should be noted that although a sine-wave jitter signal is shown in this figure, it may be preferable to use a triangular jitter signal since this provides the best "averaging out" of the EMI signal The jitter compensation results in an output voltage Vout which is independent of the input's jitter function. As a result, the invention is particularly suited for use in conjunction with control schemas which include a changeover of mode. For example, with flyback converters it is possible to use the Ipeak control method described above with reference to FIG. 6 and the frequency control method described above with reference to FIG. 4 in a single application, depending on the momentary output power level. FIG. 8 shows two control inputs for a SMPS having to modes of control: on the x-axis (abscissa) is plotted the output power, and on the y-axis (abscissa) is plotted at curve 81 the frequency control input Xf, and at curve 82 the peak primary current control input Xip. At lower power levels less than a changeover power level 83, the peak primary current control input Xip remains constant, whilst the frequency control input Xf increases linearly with power. At power levels higher than the changeover power level 83 the frequency control input Xf remains constant, whilst the peak primary current control input Xip increases with increasing power. Due to the quadratic relationship between the power and the primary peak current, this latter increase takes the general form of a square root function.

Figure 9:
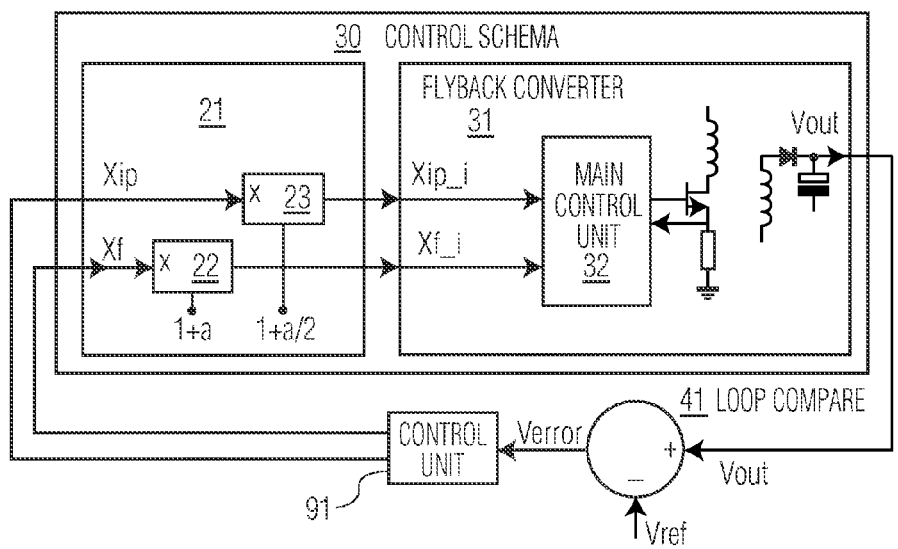
FIG. 9 shows a control schema for the flyback converter of FIG. 3, including both mode detection and control in the regulation loop.

FIG. 9 shows a control schema for the flyback converter of FIG. 3, including both mode detection and control in the regulation loop; that is to say, configured to operate the above method. The arrangement is generally similar to that shown in FIG. 6, with the exception that in this case, the error signal from the comparison between the out and the rest is fed to a mode detection and control unit 91: outputs from the mode detection and control unit 91 are fed to both the frequency jitter unit 22 and the other jitter control unit 23.

Figure 10:
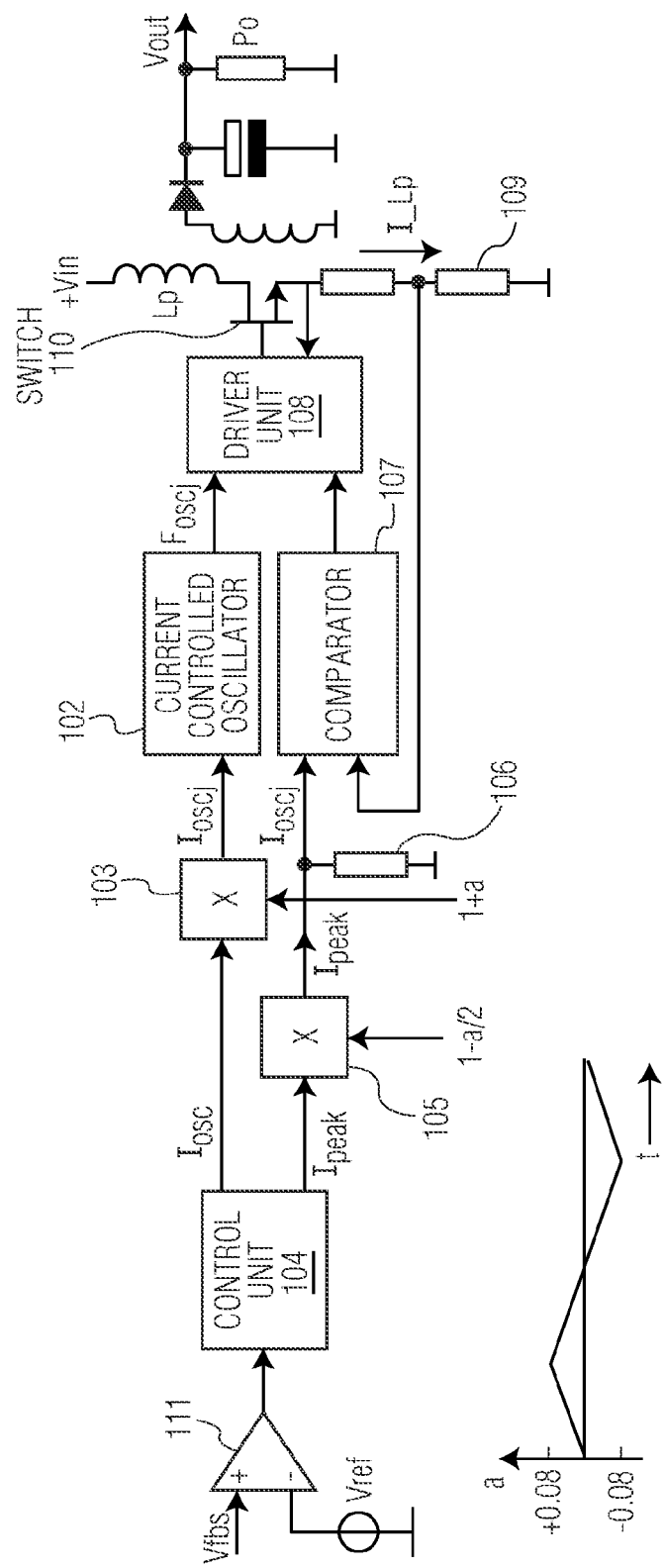
FIG. 10 shows a block circuit diagram for an embodiment of the invention applied to a flyback converter with peak primary current control.

FIG. 10 shows a block circuit diagram for an embodiment of the invention applied to a flyback converter with peak primary current control. Such an arrangement is implemented by NXP semiconductors in the integrated circuit number TEA1721, configured to operate a converter in discontinuous conduction mode, and varying either the primary peak current or switching frequency to control the output power.

In this arrangement, a current controlled oscillator 102 is fed with a current Ioscj, which comprises the current Iosc supplied from a control unit 104, which is multiplied by a jitter signal (1+a) at 103 such that $$Ioscj=(1+a)*Iosc \quad (18).$$

As shown in the lower left call-out of the diagram, in this embodiment of the jitter function that may be a symmetrical triangular function, which transitions smoothly by a fixed slope positive or negative df/dt between the ±−8% peak excursions from the average value. However, others jitter functions, such as without limitation saw-tooth functions or sine curves, may be used instead of the symmetrical triangular function shown and discussed above. The current controlled oscillator produces an oscillating signal Foscj in dependence on Ioscj; the oscillating signal Foscj is input to a logic and driver units 108. Further, the control signal Ipeak from the control unit 104, is multiplied at 105 by a correlated jitter function to result in the jittered version Ipeakj. In this embodiment, the correlated jitter function is (1−a/2). The jittered version Ipeakj is converted into a voltage signal Vpeakj by means sense resistor 106. This is fed to a comparator 107, to provide an error signal which also is input to the logic and driver unit 108. The logic and driver unit 108 drives the switch 110 of the flyback converter. The switch current is monitored by means of sense resistor 109 to provide of the second input to comparator 107. Feedback is supplied to the control unit 104 by means of a sampled feedback signal Vfbs, which is compared at a comparator 111 to a reference value Vref. The flyback converter switch 110 is thus controlled by the logic and driver unit 108, with jitter on either or both of the primary current control signal of the frequency control signal.

The jitter is added to the control current for the oscillator frequency (yielding Ioscj) and to the control current for primary peak current (Ipeakj), controlling the current in the primary winding of the transformer in such a way that constant output power is achieved. When the jitter increases Ipeakj than Foscj (Fosc=Fsw, where Fsw=switching frequency) is decreased and when the jitter decreases Ipeakj than Foscj is increased. The switching frequency is varied in a range from −8% to +8% without any change in power for each operation mode.

Figure 11:
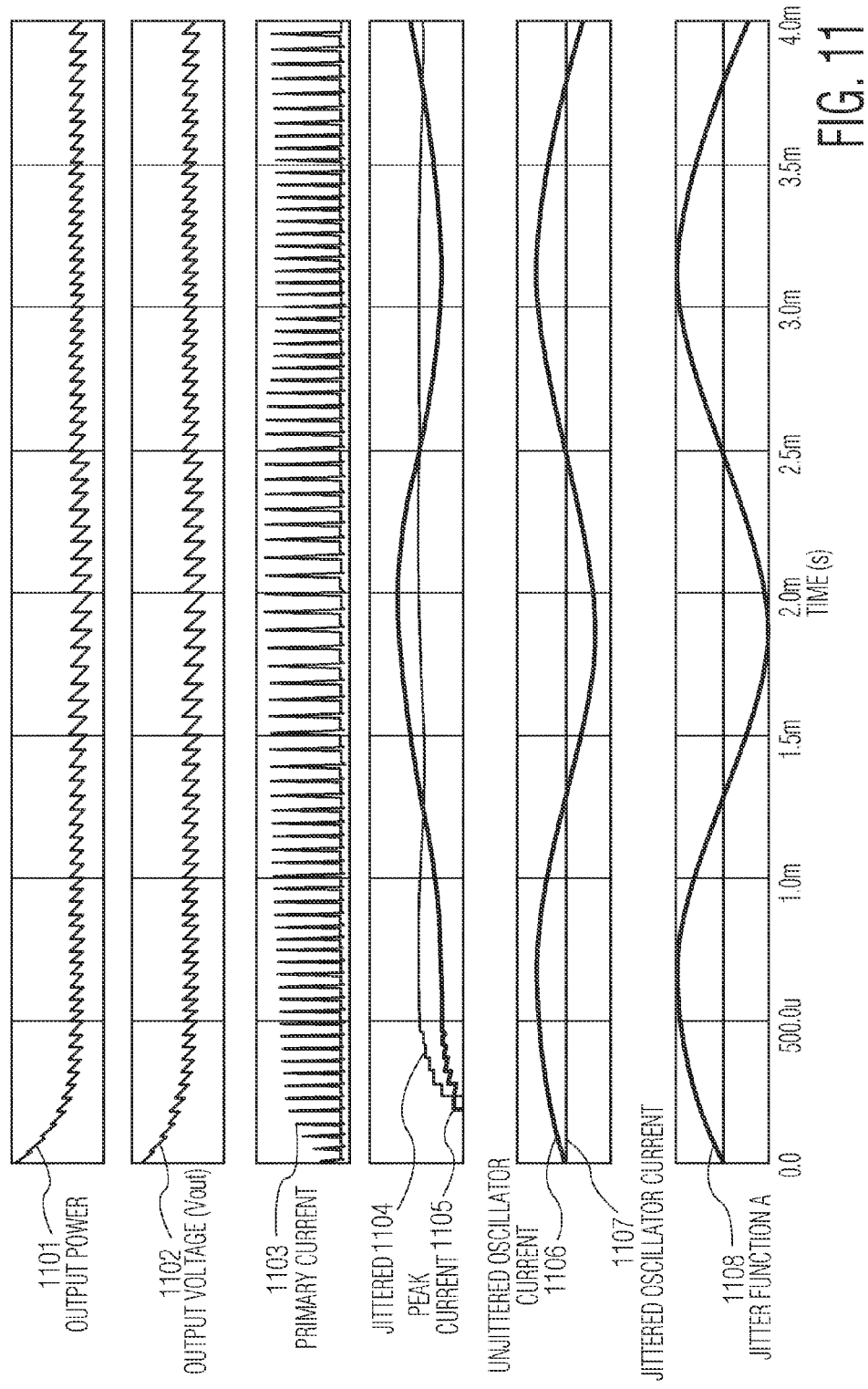
FIG. 11 shows the simulated results of operating the control schema of FIG. 10.

FIG. 11 shows the simulated results of operating the control schema of FIG. 10. Starting at the top curve the figure shows the output power 1101, the output voltage Vout 1102, the primary current 1103, the un-jittered and jittered peak current Ipeak and Ipeakj, 1104 and 1105 respectively, the un-jittered and jittered oscillator current Iosc and Ioscj 1106 and 1107 respectively, and the jitter function A at 1108. In this case, the jitter function is a sine wave. As the figure clearly shows, following a ramp-up period, the output voltage and output current are independent of the jitter signal. That is to say, by including the correlated signal, the frequency jitter has been cancelled.

Some of the examples above are designed specifically to reduce EMI interference. For reducing audible noise most effectively, the jitter can be applied randomly.

The top part of FIG. 12 shows a simplified representation of the magnetizing current in a transformer, when a fixed operating frequency is applied. The lower part of FIG. 12 shows a simplified representation of the magnetizing current in a transformer, when a fixed operating frequency is applied with random variation of the frequency where the momentary frequency F is varied randomly according to:

$$F=(1+a \cdot \text{mod}) \times F_{nom}.$$

$F_{nom}$ is the nominal frequency and a is a random number between −1 and 1 having a new random value for each next switching cycle. The value "mod" is the modulation index being a value between 0 and 1. In FIG. 12, mod is equal to 0.75.

The use of a random or pseudo-random jitter converts the noise to white noise.

The invention can be applied to AC to DC converters (for example with power factor correction), compact fluorescent lighting controllers and LED driver applications.

From reading the present disclosure, other variations and modifications will be apparent to the skilled person. Such variations and modifications may involve equivalent and other features which are already known in the art of switched mode power suppliers, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:

1. A controller for a switched mode power supply and being operable to control the switched mode power supply in dependence on a frequency input signal and in dependence on a further input signal, comprising:
   a frequency jitter unit for multiplying the frequency input signal by a frequency jitter signal to derive a modified frequency input signal to be applied to the switched mode power supply, and
   a further jitter unit for multiplying the further input signal by a further jitter signal to derive a modified further input signal to be applied to the switched mode power supply,
   wherein the further jitter signal is correlated to the frequency jitter signal such that the jitter applied by the frequency jitter unit and the jitter applied by the further jitter unit vary in proportion with each other.

2. The controller according to claim 1, wherein the correlation is such that variation in an output power of the switched mode power supply due to the frequency jitter signal is cancelled by the variation in the output power of the switched mode power supply due to the further jitter signal.

3. The controller as claimed in claim 1, wherein the frequency jitter signal has the form of one of the group comprising a triangular function, a saw-tooth function and a sine function.

4. The controller as claimed in claim 1, wherein a frequency of the frequency jitter signal is less than 1 kHz, and/or a depth of the frequency jitter signal is between ±0.9% and ±33%.

5. The controller as claimed in claim 1, configured to control a flyback converter mode by means of primary peak current control, wherein the further input is primary peak current, and the further jitter signal is opposite in sign and half the magnitude of the frequency jitter signal.

6. The controller as claimed in claim 1 configured to control a buckboost converter or a flyback converter, and further configured to operate the converter in discontinuous conduction mode.

7. The controller as claimed in claim 1, wherein the frequency jitter signal comprises a jitter that varies randomly or pseudo randomly over time.

8. The controller as claimed in claim 1, having a yet further input signal different to the further input signal and being adapted to operate according to a first control mode at a first output power, and a second, different, control mode at a second output power, further comprising
   a yet further jitter unit for multiplying the yet further input signal by a yet further jitter signal,
   wherein yet the further jitter signal is correlated to the frequency jitter signal such that the jitter applied by the yet further jitter unit and the jitter applied by the frequency jitter unit vary in proportion with each other.

9. An integrated circuit comprising the controller as claimed in claim 1.

10. A switched mode power supply comprising a controller as claimed in claim 1 and the switched mode power supply controlled by the controller.

11. A method of controlling a switched mode power supply in dependence on a frequency input and in dependence on a further input, comprising:
   multiplying the frequency input by a frequency jitter signal; and
   multiplying the further input by a further jitter signal,
   wherein the further jitter signal is correlated to the frequency jitter signal such that the jitter applied by the frequency jitter signal and the jitter applied by the further jitter signal vary in proportion with each other.

12. The method of claim 11, wherein the correlation is such that variation in an output power of the switched mode power supply due to the frequency jitter signal is cancelled by the further jitter signal.

13. The method of claim 11, wherein the frequency jitter signal has the form of one of the group comprising a triangular function, a saw-tooth function and a sine function.

14. The method of claim 11, wherein at least one of a jitter frequency is less than 1 kHz, and a jitter depth is between 0.9% and 33%.

15. The method of claim 11, wherein the controller operates according to a first control mode at a first output power, and a second, different, control mode at a second output power,
   the method comprising, whilst the controller is operating in the second control mode, multiplying a yet further input, different to the further input, by a yet further jitter signal,
   and wherein the yet further jitter signal is correlated to the frequency jitter signal such that the jitter applied by the yet further jitter unit and the jitter applied by the frequency jitter unit vary in proportion with each other.

* * * * *